United States Patent [19]

Minami

[11] 4,020,420
[45] Apr. 26, 1977

[54] ELECTRONIC CHANNEL SELECTOR

[75] Inventor: Shunji Minami, Katano, Japan

[73] Assignee: Matsushita Electric Industrial Co., Ltd., Japan

[22] Filed: Mar. 17, 1976

[21] Appl. No.: 667,560

[30] Foreign Application Priority Data

Mar. 20, 1975 Japan .............................. 50-34158
May 13, 1975 Japan .............................. 50-56941

[52] U.S. Cl. .............................. 325/464; 325/453; 334/15
[51] Int. Cl.² .......................................... H04B 1/16
[58] Field of Search .......... 325/334, 335, 453, 459, 325/464, 465, 468; 334/11, 14, 15

[56] References Cited

UNITED STATES PATENTS

| | | | |
|---|---|---|---|
| 3,753,172 | 8/1973 | Sakamoto ............................. | 334/15 |
| 3,777,290 | 12/1973 | Pittman et al. ....................... | 334/15 |
| 3,824,474 | 7/1974 | Sakamoto .......................... | 325/464 |

*Primary Examiner*—Robert L. Griffin
*Assistant Examiner*—Marc E. Bookbinder
*Attorney, Agent, or Firm*—Burgess Ryan and Wayne

[57] ABSTRACT

The invention discloses an electronic channel selector which comprises a plurality of variable resistors, a plurality of switches connected to the variable resistors, respectively, and a voltage memory circuit. When one of the switches is closed, the output voltage of the variable resistor corresponding to the closed switch is transferred into and stored in the voltage memory circuit, and in response to the output voltage from the memory circuit the capacitance of a varactor may be varied for selecting a desired channel. The electronic channel selector in accordance with the present invention may be used instead of the conventional mechanical tuners, the channel selection may be much facilitated, the defects encountered in the conventional electronic channel selectors may be overcome, and any desired channel may be stored.

3 Claims, 8 Drawing Figures

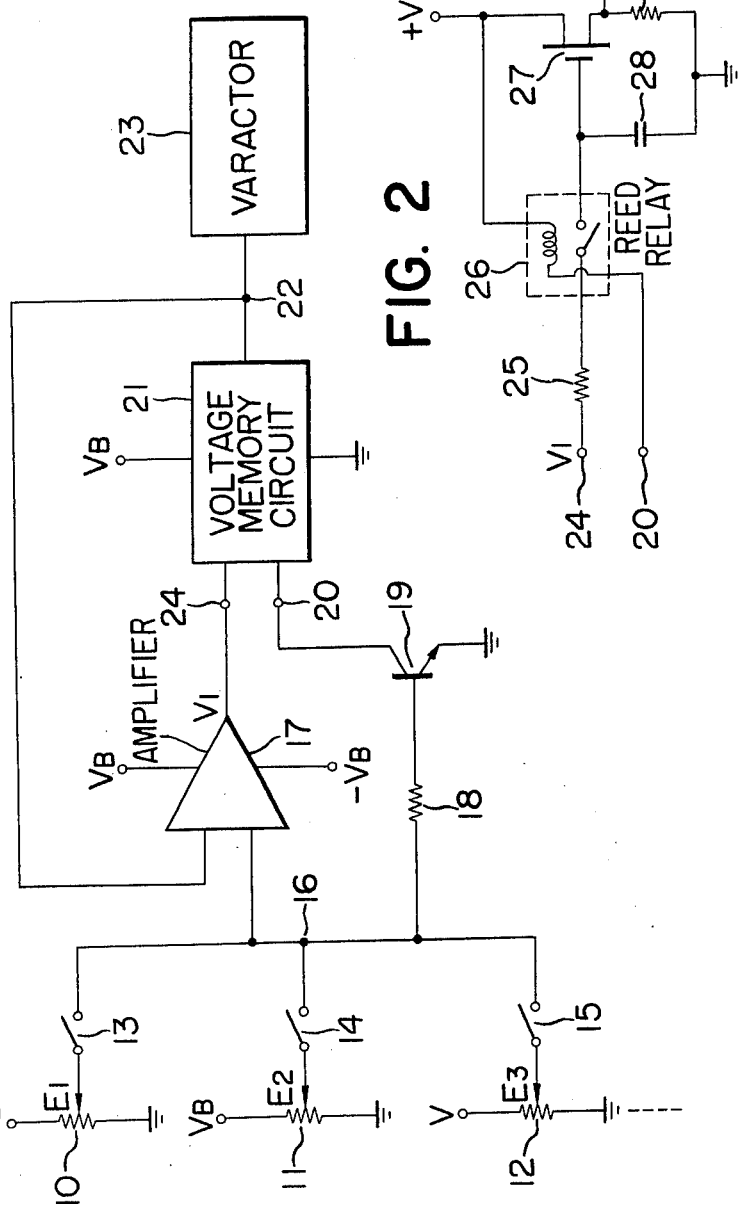

ELECTRONIC CHANNEL SELECTOR

BACKGROUND OF THE INVENTION

The present invention relates to an electronic channel selector which may be used instead of the conventional mechanical tuners.

The conventional mechanical tuners have a number of sliding or moving parts which are inevitably subjected to wear, resulting in the breakdown or malfunction of the tuner. Furthermore, the mechanical tuners are complex in construction and are therefore difficult to fabricate. To overcome these problems inherent to the mechanical turners, there has been devised and demonstrated an electronic channel selector or tuner of the type in which the output from a precision variable resistor is applied to a plurality of switching circuits for selecting a desired channel. Therefore, the switching circuits and the switching means equal in number of the channels to be selected must be provided. Furthermore, it has been extremely difficult to incorporate in the conventional electronic channel selectors a memory device which may automatically select the channel which had been selected before the main switch connected to the power supply was opened.

SUMMARY OF THE INVENTION

One of the objects of the present invention is therefore to provide an electronic channel selector which is very simple in construction yet highly reliable and dependable in operation.

Another object of the present invention is to provide an electronic channel selector which incorporates therein a voltage memory circuit so that the overall construction of the channel selector can be much simplified.

A further object of the present invention is to provide an electronic channel selector which incorporates therein a voltage memory circuit which is capable of selecting the channel which had been selected before a main switch connected to a power supply was opened when the main switch is closed again.

To the above and other ends, the present invention provides an electronic channel selector comprising a plurality of variable resistors, a plurality of switches the input terminals of which are connected to the output terminals, respectively of the variable resistors and the output terminals of which are connected to a common junction, an input resistor whose input terminal is connected to the common junction and whose output terminal is connected to the input terminal of a reed relay, a MOS field-effect transistor whose gate is connected to the output terminal of the reed relay, a nonpolarized electrolytic capacitor interconnected between the ground and the gate of the field-effect transistor, an output resistor interconnected between the ground and the source of the field-effect transistor, switching means whose input terminal is connected to the common junction and whose output is connected to the coil of the reed relay so that when said switching means is turned on the coil is energized to close the reed relay, and a varactor whose input terminal is connected to the source of the field-effect transistor, whereby the capacitance of the varactor can be varied in response to the source-follower voltage of the field-effect transistor.

BRIEF DESCRIPTION OF THE DRAWING

FIG. 1 is a circuit diagram of a first embodiment of the present invention;

FIG. 2 is a circuit diagram of a voltage memory circuit thereof;

Identical reference numerals are used to designate similar parts throughout the figures.

DESCRIPTION OF THE PREFERRED EMBODIMENTS

First Embodiment, FIGS. 1 and 2

Figure 3:
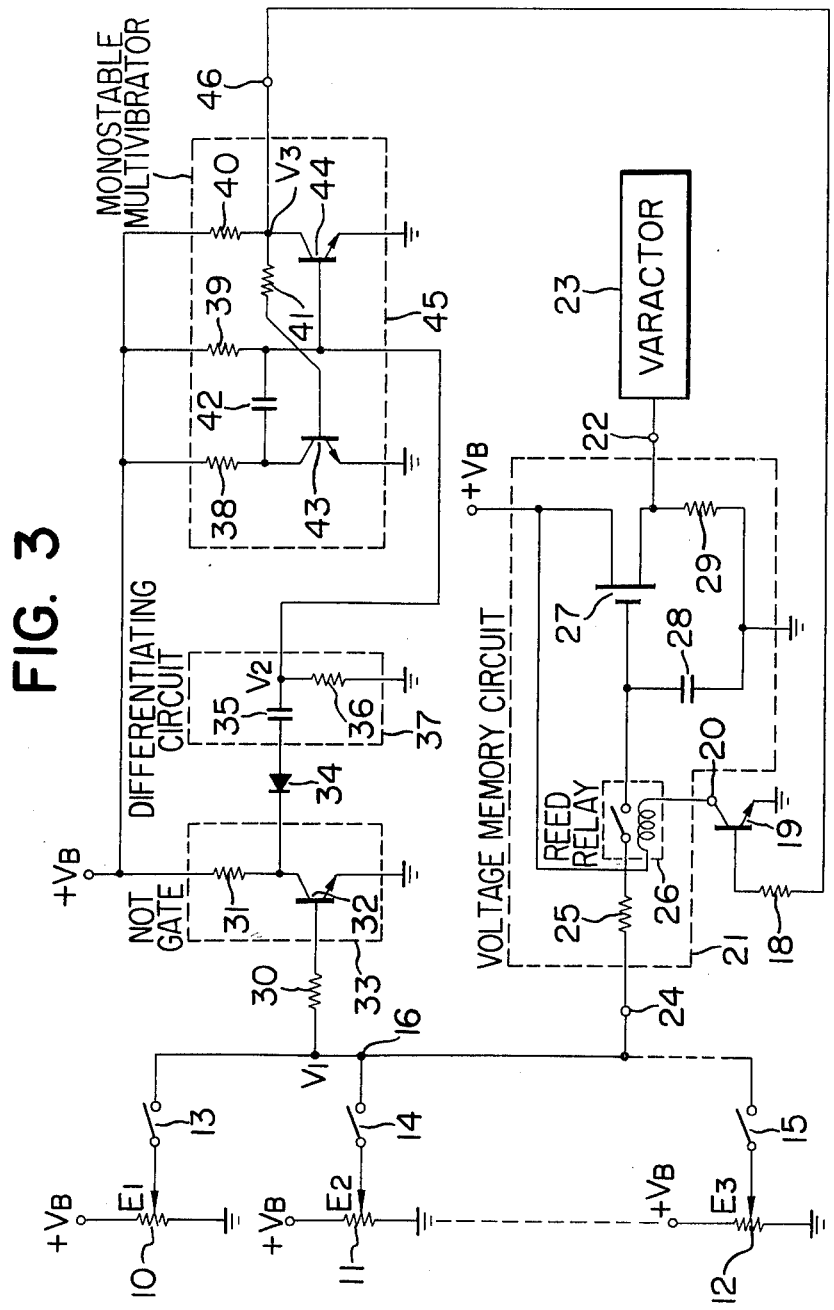
FIG. 3 is a circuit diagram of a second embodiment of the present invention.

In FIG. 1 there is shown a circuit diagram of a first embodiment of an electronic channel selector in accordance with the present invention. One end of the resistor of a variable resistor 10, 11 or 12 is connected to a +V power supply while the other end is grounded. An output terminal or arm $E_1$, $E_2$ or $E_3$ is connected to a movable contact of a switch 13, 14 or 15, and the stationary contacts of these switches 13, 14 and 15 are connected to a common junction 16 which in turn is connected to the noninverting input terminal of an operational amplifier 17 and to the base of a switching transistor 19 through a resistor 18. The emitter of the switching transistor 19 is grounded while the collector is connected to a firt input terminal 20 of a voltage memory circuit 21 the output terminal 22 of which is connected to the inverting input terminal of the operational amplifier 17 and to a varactor 23. The output of the operational amplifier 17 is connected to a second input terminal 24 of the voltage memory circuit 21.

In FIG. 2, there is shown a circuit diagram of the voltage memory circuit 21. The second input terminal 24 is connected through an input resistor 25 to the movable contact of a reed relay 26 the stationary contact of which is connected to the gate of a MOS field-effect transistor 27. The first input terminal 20 is connected through the coil of the reed relay 26 to a +V power supply terminal. A nonpolarized electrolytic capacitor 28 is interconnected between the gate of the field-effect transistor 27 and the ground, and an output resistor 29 is connected between the ground and the source of the field-effect transistor 27. The drain of the field-effect transistor 27 is connected to the +V terminal, and the output terminal 22 is connected to the source of the field-effect transistor 27.

Next the mode of operation of the first embodiment with the above construction will be described. It is assumed the output voltage Vo from the voltage memory 21 to be zero. When the switch 13 is closed, the current the magnitude of which is dependent upon the output $E_1$ of the variable resistor 10 flows through the resistor 18 into the base of the switching transistor 19 so that the latter is turned on and consequently the reed relay 26 is closed. Since $E_1 >$ Vo, the output from the operational amplifier 17 is almost equal to $+V_B$, and the capacitor 28 is charged to this voltage. As the voltage across the capacitor 28; that is, the gate voltage of the field-effect transistor 27 is increased, the output voltage Vo is increased accordingly, toward $E_1$. When the output voltage Vo approaches $E_1$, the output from the operational amplifier 17 decreases and becomes equal to the voltage across the capacitor 28 so that the output voltage $Vo$ equals $E_1$ ($Vo = E_1$). This output voltage is stored in the voltage memory 21 even when the switch 13 is opened, and the output voltage at the output terminal 22 is maintained constant.

Next when the switch 14 is closed, the switching transistor 19 is turned on and then the read switch 26 is closed in the manner described above. When $E_1 > E_2$, the output voltage from the operational amplifier 17 approaches $-V_B$ and consequently the capacitor 28 is discharged. As a result, the output voltage decreases toward $E_2$. When the output voltage $Vo$ approaches $E_2$, the output from the operational amplifier 17 increases and finally becomes equal to the voltage across the capacitor 28. That is, $Vo = E_2$. This output voltage can be stored in the voltage memory 21 even when the switch 14 is opened.

From the foregoing description, it is seen that when the output voltage $E_1$, $E_2$ or $E_3$ of the variable resistor 10, 11 or 12 is higher than the voltage which triggers the switching transistor 19, the output voltage $E_1$, $E_2$ or $E_3$ is transferred into and stored in the voltage memory circuit 21 by closing the switch 13, 14 or 15. That is, when one of the switches 13, 14, 15 and so on is closed, one of the output voltages $E_1$, $E_2$, $E_3$,... set by the variable resistors 10, 11, 12,... appears as the output voltage $Vo$ of the voltage memory 21 which is applied to the varactor 23 for selecting a desired channel.

Second Embodiment, FIGS. 3 and 4

The second embodiment shown in FIG. 3 is substantially similar in construction to the first embodiment shown in FIG. 1 except that the operational amplifier 17, a rectangular wave-form generator consisting of a NOT gate 33, a differentiating circuit 37 and a monostable multivibrator 45 is used. The common junction 16 of the switches 13, 14 and 15 is connected through a resistor 30 to the base of a transistor 32 of the NOT gate 33. The emitter of the transistor 32 is grounded while the collector is connected through a resistor 31 to a $+V_B$ terminal.

The output from the NOT gate 33 is transmitted through a diode 34 to the differentiating circuit 37 consisting of a capacitor 35 and a resistor 36. The pulse output from the differentiating circuit 37 is transmitted to the input terminal of the monostable multivibrator 45 consisting of resistors 38 through 41, a capacitor 42 and transistors 43 and 44. The output terminal 46 of the multivibrator 45 is applied through the resistor 18 to the base of the switching transistor 19.

Figure 4A:
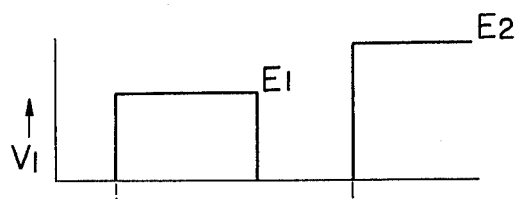
FIGS. 4a through 4e show waveforms of the voltage outputs at various points in the circuit shown in FIG. 3, and are used for the explanation of the mode of operation thereof.
Figure 4B:
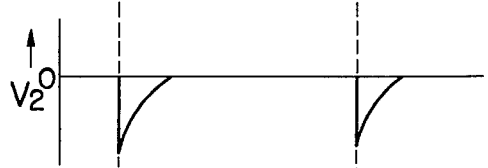
Figure 4C:
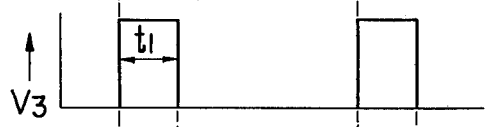
Figure 4D:
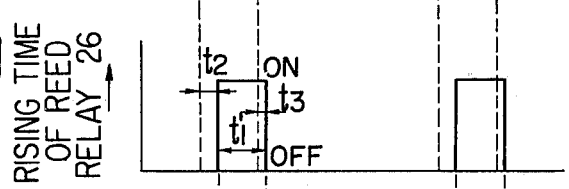

Next with particular reference to FIGS. 4a through 4e, the mode of operation of the second embodiment with the above construction will be described. When the switch 13 is closed, the output voltage $E_1$ (See FIG. 4a) of the variable resistor 10 is applied to the NOT gate 33, and the output from the NOT gate 33 is differentiated as shown in FIG. 4b by the differentiating circuit 37. In response to the output $V_2$ from the differentiating circuit 37, the monostable multivibrator 45 is triggered to generate the rectangular waveform with a pulse duration $t$ as shown in FIG. 4c. In response to the output pulse $V_3$ from the monostable multivibrator 47, the switching transistor 19 is turned on and consequently the reed relay 26 is closed. As shown in FIG. 4d, the rising time of the reed relay 26 lags behind the rising time of the output pulse $V_3$ (See FIG. 4c) from the vibrator 47 by $t_2$. The falling time also lags by $t_3$ behind the falling time of the output pulse $V_3$.

Figure 4E:
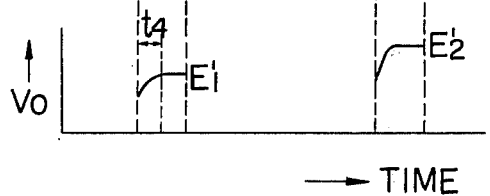

Meanwhile as the switch 13 is closed, the output voltage $E_1$ of the variable resistor 10 is applied through the input resistor 25 to the capacitor 28 so that the voltage across the capacitor 28 increases as indicated by the curve $E_1'$ in FIG. 4e during the time interval $t'_1$ (See FIG. 4d). Therefore the output voltage $Vo$ from the field-effect transistor 27 rises to $E_1'$ as shown in FIG. 44. This output voltage $Vo$ can be stored in the memory circuit 21 even after the switch 13 is kept closed.

Next when the switch 14 is closed, the output voltage $E_2$ of the variable resistor 11 is applied to the voltage memory 21 and to the NOT gate 33. Therefore, the voltage across the capacitor 28 rises to $E_2$ during the time monostable multivibrator 47 gives the pulse output $V_3$ so that the output voltage $Vo$ from the voltage memory circuit 21 rises to $E_2'$ as shown in FIG. 4e. The output voltage $Vo$ is applied to the varactor 23 for selecting a desired channel corresponding to the closed switch 13, 14 or 15.

In general, it takes 30 msec at the least to manually close or open the switch 13, 14 or 15. Therefore the pulse duration $t_1$ of the output pulse from the monostable multivibrator 47, the charging time $t_1'$; that is the time for charging the capacitor 28, and the time interval $t_4$ required for charging the capacitor 28 to a predetermined level are so selected as to satisfy the following relations:

50 msec $> t_1$, and $t_1' > t_4$.

Thus, when one of the switches 13, 14, 15 and so on is closed, one of the output voltages $E_1$, $E_2$, $E_3$ and so on which are set to different levels by the variable resistors 10, 11, 12 and so on can be derived as the output voltage $Vo$ (source-follower voltage) of the field-effect transistor 27 and applied to the varactor 23. Even when the channel selector is disconnected from the power supply and then connected to it again, the channel which has been selected when the channel selector was disconnected from the power supply will be selected.

What is claimed is:
1. An electronic channel selector comprising
a. at least three variable resistors,
b. a separate switch each having an input terminal connected to the output terminal of each of said variable resistors and having an output terminal connected to a common junction,
c. an input resistor having an input terminal connected to said common junction,
d. a reed relay having an input terminal connected to the output terminal of said input resistor,
e. a MOS field-effect transistor having a gate connected to the output terminal of said reed relay,
f. a nonpolarized electrolytic capacitor interconnected between ground and the gate of said field-effect transistor,
g. an output resistor interconnected between the source of said field-effect transistor and the ground,
h. switching means having an input terminal connected to the common junction and an output terminal connected to one end of the coil of said reed delay for energizing said relay coil to close said reed relay in response to current through any of said separate switches, and i. a varactor responsive to the source-follower voltage of said field-effect transistor.

2. An electronic channel selector as set forth in claim 1 further comprising an operational amplifier having a noninverting input terminal connected to said common junction and an inverting input terminal connected to the source of said field-effect transistor and an output terminal connected to said input terminal of said input resistor, whereby when one of said switches is closed, the output voltage of the variable resistor connector to said closed switch can be derived from the source-follower voltage of said field-effect transistor in response to which the capacitance of said varactor is varied.

3. An electronic channel selector as set forth in claim 1 further comprising a rectangular waveform generator connected to the common junction and consisting of a NOT gate connected to said common junction, a differentiating circuit connected to an output of said NOT gate, and a monostable multivibrator connecting an output of said differentiating circuit to said switching means, whereby when one of said separate switches is closed, said reed relay is closed in response to the energizing of said switching means by the rectangular waveform pulse output from said monostable multivibrator and whereby the output voltage of the variable resistor corresponding to said closed switch is memorized on said capacitor during the pulse duration time of said rectangular waveform pulse output.

* * * * *

UNITED STATES PATENT OFFICE
CERTIFICATE OF CORRECTION

Patent No. 4,020,420  Dated April 26, 1977

Inventor(s) Shunji Minami

It is certified that error appears in the above-identified patent and that said Letters Patent are hereby corrected as shown below:

In the Title Page, under "Inventor": "Katano" should be --Osaka-fu--.

Column 4, last line: "delay" should be --relay--.

Signed and Sealed this

Fifteenth Day of November 1977

[SEAL]

Attest:

RUTH C. MASON  
*Attesting Officer*

LUTRELLE F. PARKER  
*Acting Commissioner of Patents and Trademarks*